(12) United States Patent
Hu

(10) Patent No.: US 8,267,552 B2
(45) Date of Patent: Sep. 18, 2012

(54) LIGHT-TRANSMISSIVE SHELL CAPABLE OF INTENSIFYING ILLUMINANT AND WIDE-ANGLE LIGHT TRANSMISSION

(76) Inventor: Wen-Sung Hu, Rende Township, Tainan County (TW)

(*) Notice: Subject to any disclaimer, the term of this patent is extended or adjusted under 35 U.S.C. 154(b) by 120 days.

(21) Appl. No.: 12/838,595

(22) Filed: Jul. 19, 2010

(65) Prior Publication Data
US 2012/0014116 A1 Jan. 19, 2012

(51) Int. Cl.
*F21V 3/02* (2006.01)
(52) U.S. Cl. ............ 362/311.02; 362/311.06; 362/311.1
(58) Field of Classification Search ............ 362/311.01, 362/311.03, 311.04, 311.05, 311.06, 311.09, 362/311.13, 311.14, 311.1, 355, 363, 255
See application file for complete search history.

(56) References Cited

U.S. PATENT DOCUMENTS

| 1,581,781 | A | * | 4/1926 | Bridges et al. | 362/311.09 |
| 1,912,119 | A | * | 5/1933 | Allen | 362/363 |
| 2,244,737 | A | * | 6/1941 | Stewart | 362/311.14 |
| 2,263,061 | A | * | 11/1941 | Allen | 362/311.04 |
| 6,109,771 | A | * | 8/2000 | Konagaya | 362/311.01 |

* cited by examiner

Primary Examiner — Y My Quach Lee
(74) Attorney, Agent, or Firm — Alan Kamrath; Kamrath IP Lawfirm, PA

(57) ABSTRACT

A light-transmissive shell capable of intensifying an illuminant and wide-angle light transmission includes a lens body and an extension portion integrally extended from the lens body in a vertical direction or at an acute angle to the vertical direction. The lens body includes an outer top surface structured as a convexity and an inner bottom surface structured as a flat surface or an inner concavity. The extension portion includes an inner surface extending around from the inner bottom surface of the lens body. An arcuate surface is formed as a joint between the inner bottom surface of the lens body and the inner surface of the extension portion. The light emitted by an illuminant is intensified through the lens body and guided into a wide-angle light through the extension portion.

20 Claims, 16 Drawing Sheets

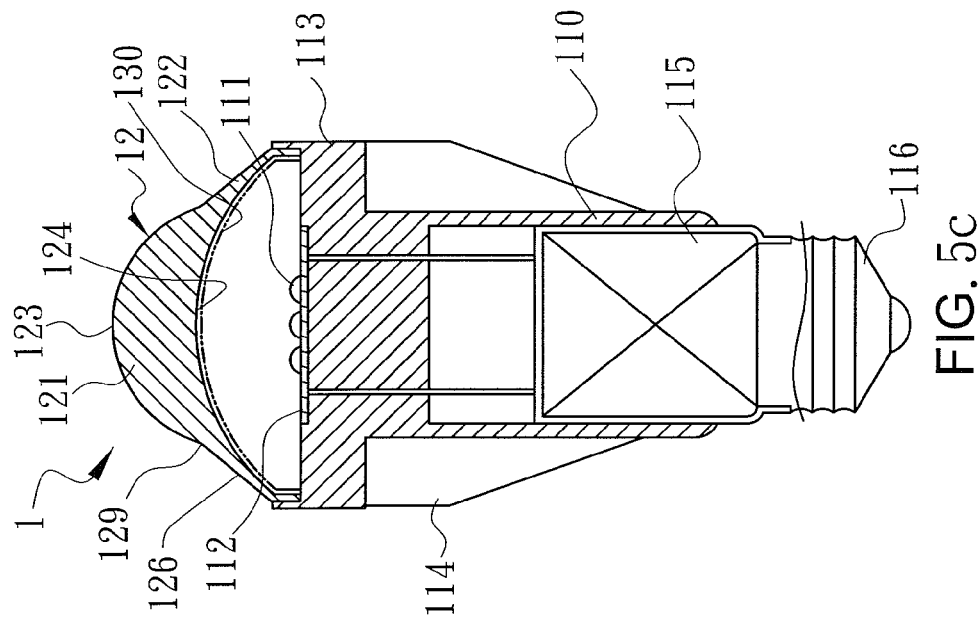
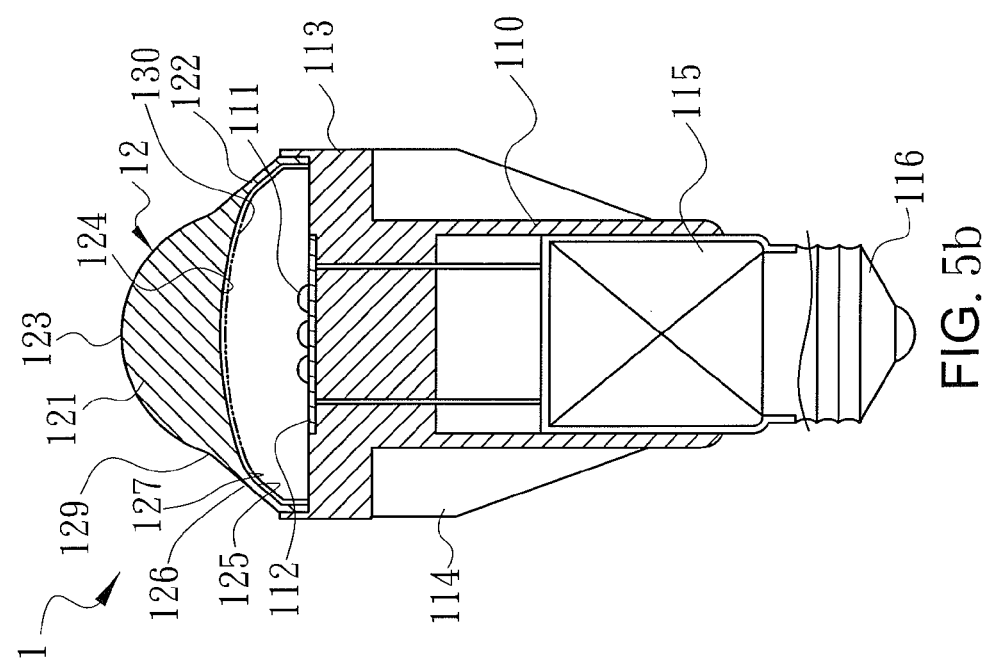

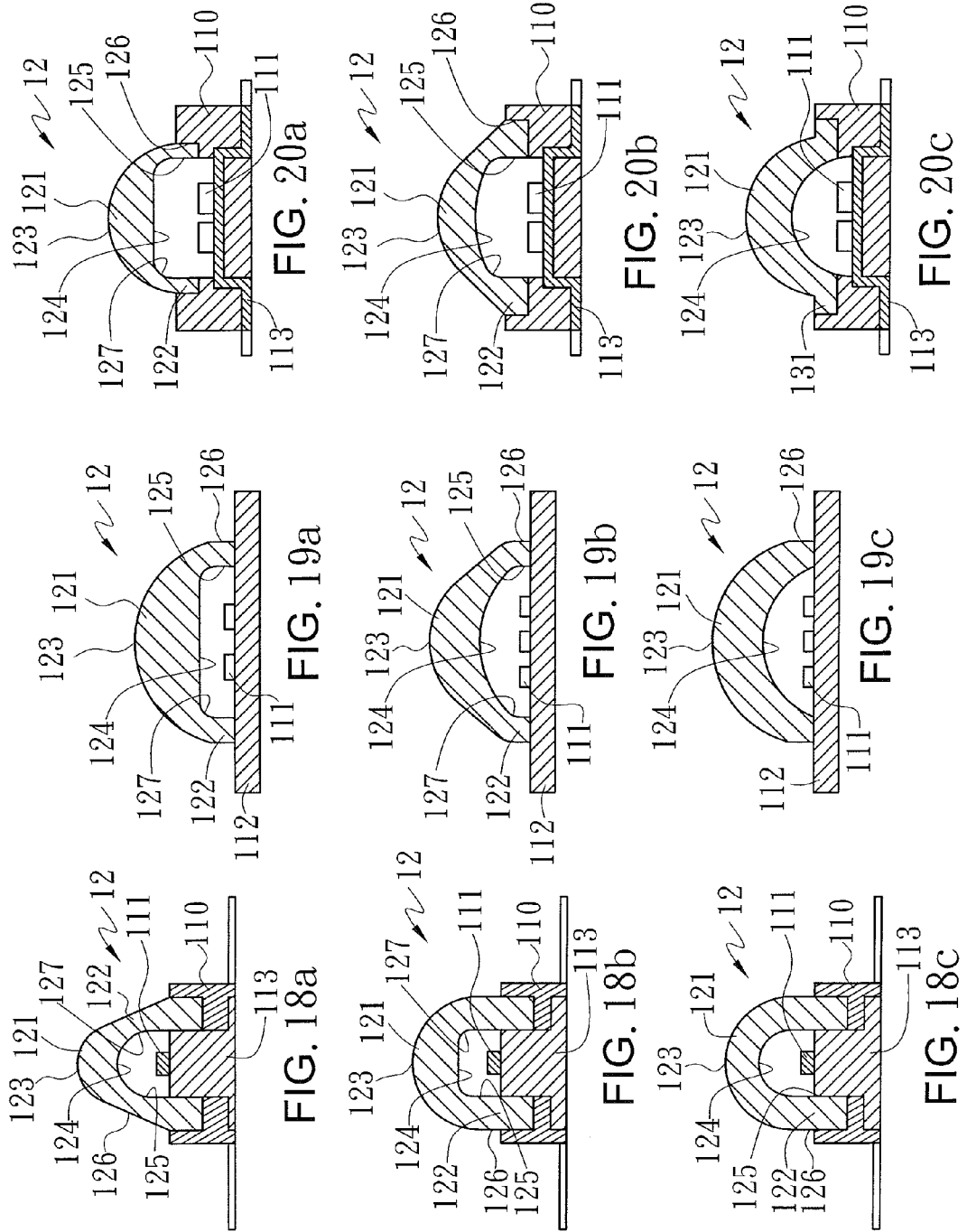

LIGHT-TRANSMISSIVE SHELL CAPABLE OF INTENSIFYING ILLUMINANT AND WIDE-ANGLE LIGHT TRANSMISSION

BACKGROUND OF THE INVENTION

1. Field of the Invention

This present invention relates to a light-transmissive shell for a bulb or a lamp and, more particularly, to a light-transmissive shell capable of intensifying an illuminant and wide-angle light transmission.

2. Description of the Related Art

Along with progressive technology of illuminant illuminants, an incandescent bulb, a Hot Cathode Fluorescent Lamp (HCFL), a Cold Cathode Fluorescent Lamp (CCFL), and later a Light-Emitting Diode (LED) as various illuminants are developed unceasingly. Recently, being advantageously featured with power saving, small size, long service life, and solidity, the LED is considered in the field of illuminant technology.

For response to the green energy policy, the tungsten lamp bulbs will exit from all countries in a specified year. The LED bulbs are also considered to be a substitute for conventional bulbs. However, there are gradually some defects in the LED bulbs used as illuminant substitutes for the conventional tungsten lamp bulbs and halogen cup lamps. For example, in the aspects of optical efficiency, service life, and heat sink that are closely linked, the heat sink confined by the volume of a conventional tungsten wide-angle lamp bulb causes E26, E27, and B22 tungsten LED bulbs not to work for brightness of maximum wattage. Further, there is an issue on the LED bulb used with a MR16 halogen lamp. Specifically, if a high illumination bulb is used in an original height of an installed lamp holder, a low illumination LED bulb cannot function for required illumination. Further, the LED bulb cannot function as a PAR-based halogen lamp (in an expanding transparent shell in the form of a reflecting light cup) for central light intensification and wide-angle light transmission. Specifically, the spotlight and wide-area halation projected by the PAR-based halogen lamp on a remote billboard may highlight a theme and a background picture, while existing LED bulbs for the PAR system cannot work for brightness, illumination angle, and halo area.

FIGS. 1 and 2 illustrate two conventional LED bulbs 3 each including a plurality of LEDs (SMD or chip) 301 on a substrate 302, a heat sink 303 with fins 304, a driver 305 provided in a driver pedestal 308 to drive LEDs 301, and a transparent shell 307. A plurality of spaced V-shaped grooves 306 is formed in an upper end of heat sink 303. The spaced angle of grooves 306 depends on a required light-emitting angle, and at least one LED 301 is provided in each groove 306. The shell 307 covers a top of heat sink 303 and has a flat or convex inner surface so that light emitted by LEDs 301 through shell 307 may be at a required illumination angle. However, shell 307 cannot transmit the light emitted by LEDs 301 at a wide-angle. Thus, bulbs 3 cannot function for light projection and wide-area halo illumination at the same time.

FIG. 3 illustrates another conventional LED bulb 4 which includes a plurality of LEDs (SMD or chip) 401 on a substrate 402, a heat sink 403 with fins 404, a driver 405 provided in a driver pedestal 408 to drive the LEDs 401, and a transparent shell 406. The shell 406 covers a top of heat sink 403 and is in the form of a semicircle so that shell 406 may guide the light emitted by LEDs 301 at a wide-angle. However, the volume of LED bulb 4 must be equal to that of tungsten lamp bulb to allow installation in a conventional lamp holder device for embedded tungsten lamp bulbs. The heat sink of maximum volume for the conventional LED bulb cannot work as the tungsten lamp bulb of 100 W LUX in the conditions of photo efficiency and service life for reading at a required illumination angle.

Thus, what is considered by LED suppliers is the fact that the LED bulb is fully the same as the conventional bulb in the requirements of size, service life, luminance, illumination angle, and halation, and may be installed in an original height for the conventional bulb and obtain the light illumination the same as the conventional bulb in the original environments of entertainment places, storefronts, and billboards. Thus, the determined luminance and halation may be achieved. No cost of the lamp device and bulb is spent, such as the costs of lamp device, LED bulb, and wiring, due to insufficient luminance and halation, and no extra loss of business is caused by the business location reconstruction that leads to a business stop.

BRIEF SUMMARY OF THE INVENTION

In view of the defects of the prior art, this invention provides a light-transmissive shell capable of intensifying an illuminant and wide-angle light transmission to increase the illumination efficiency.

To achieve the foregoing objective, a light-transmissive shell of the present invention includes a lens body having an outer top surface and an inner bottom surface opposite to the outer top surface. The outer top surface of the lens body is structured as a convex face, and the inner bottom surface of the lens body is structured as a flat surface or an inner concave face. The light-transmissive shell further includes an extension portion having an outer surface and an inner surface opposite to the outer surface. The outer surface of the extension portion extends around and from an outer edge of the outer top surface of the lens body, and the inner surface of the extension portion extends around and from an outer edge of the inner bottom surface of the lens body. An arcuate surface is formed as a joint between the inner bottom surface of the lens body and the inner surface of the extension portion.

In a preferred form, the extension portion is integrally extended from the lens body in a vertical direction or extended at an acute angle to the vertical direction. An annular, arcuate concave is formed as a joint between the outer top surface of the lens body and the outer surface of the extension portion. A matte surface layer is formed on the inner surface of the extension portion, the inner bottom surface of the lens body, and the arcuate surface by sandblasting, laminating, laser processing, or injection molding.

According to the light-transmissive shell of the present invention, the light emitted by an illuminant is intensified through the lens body and guided and transmitted into a wide-angle light through the extension portion. With the arcuate surface between the inner bottom surface of the lens body and the inner surface of the extension portion and the arcuate concave between the outer top surface of the lens body and the outer surface of the extension portion, the section difference from the intensified light projected from the lens body to the light transmitted from the extension portion is improved and then formed into an evenly projected light. Further, when multiple LED illuminants are collected, the inner concave face of the inner bottom surface of the lens body may be used for a wide intensified light area focused in the lens body for achieving the effect of light intensification. Thus, the central luminance of an illuminant may be intensified and even intensified several times and may be structured as the halation required for luminance. The optical structure of the light-transmissive shell of the present invention is used for intensifying the light, so less LEDs are used for the required luminance, and less power is relatively used which may prevent heat from increasing, achieving the effect of carbon decrease and energy saving.

The present invention will become clearer in light of the following detailed description of illustrative embodiments of this invention described in connection with the drawings.

DESCRIPTION OF THE DRAWINGS

The illustrative embodiments may best be described by reference to the accompanying drawings where:

FIGS. 5b and 5c show two modified embodiments of the light-transmissive shell of FIG. 5a that are respectively applied to the bulb;

FIGS. 18a through 18c show three embodiments of the light-transmissive shell of the present invention respectively provided on a heat sink to package a LED chip;

FIGS. 19a through 19c show three embodiments of the light-transmissive shell of the present invention that are respectively provided on a substrate to package LED chips; and FIGS. 20a through 20c show three embodiments of the light-transmissive shell of the present invention respectively used to package several LED chips for SMD (Surface-Mount Device) LEDs.

All figures are drawn for ease of explanation of the basic teachings of the present invention only. Where used in the various figures of the drawings, the same numerals designate the same or similar parts.

DETAILED DESCRIPTION OF THE INVENTION

Figure 1:
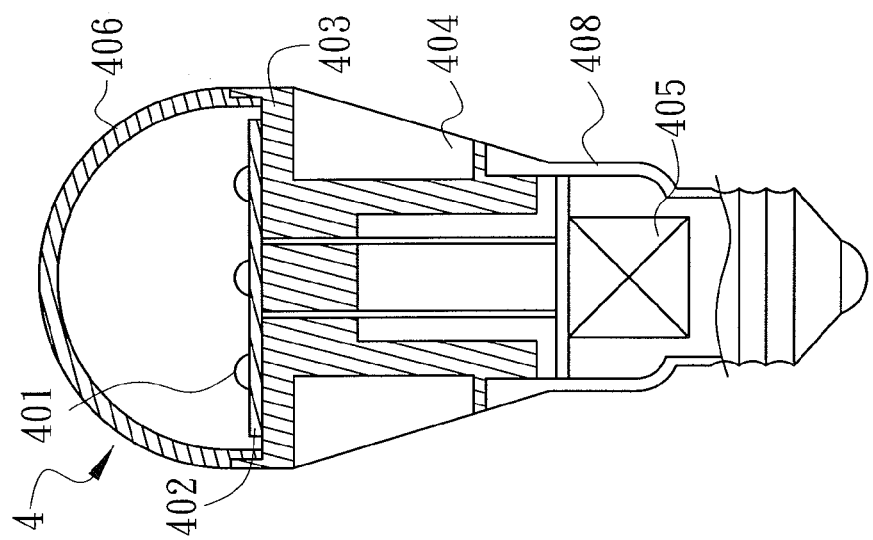
FIG. 1 is a top view of a conventional bulb and a cross sectional view of the bulb taken along a sectional line of the top view of FIG. 1.
Figure 2:
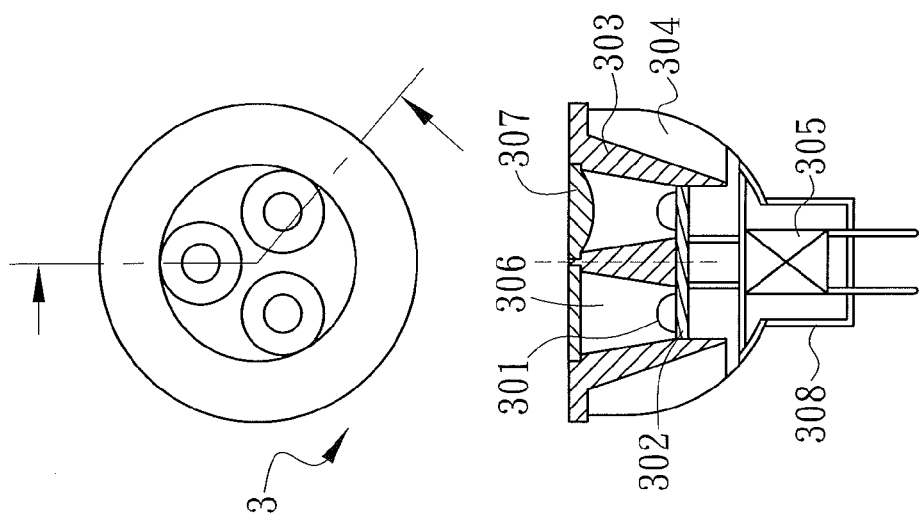
FIG. 2 is a top view of another conventional bulb and a cross sectional view of the bulb taken along a sectional line of the top view of FIG. 2.
Figure 3:
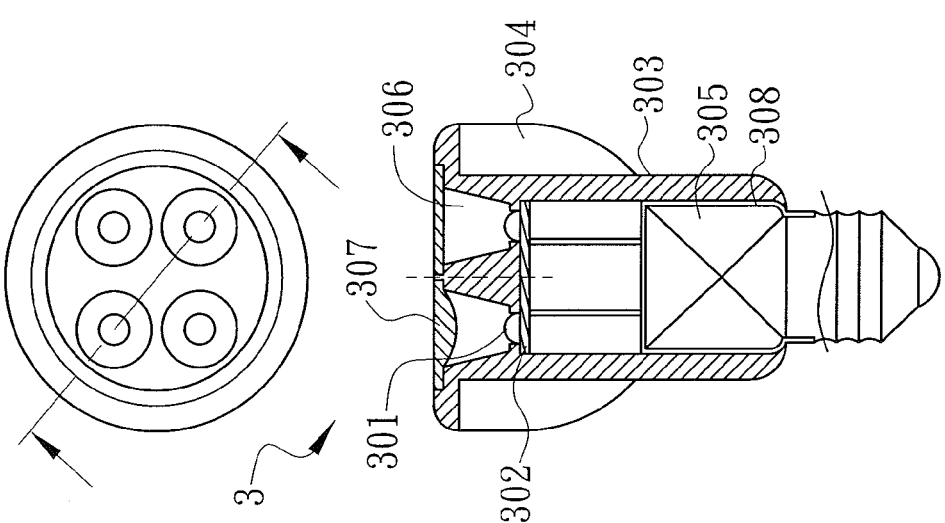
FIG. 3 is a cross sectional view of another conventional bulb.
Figure 5A:
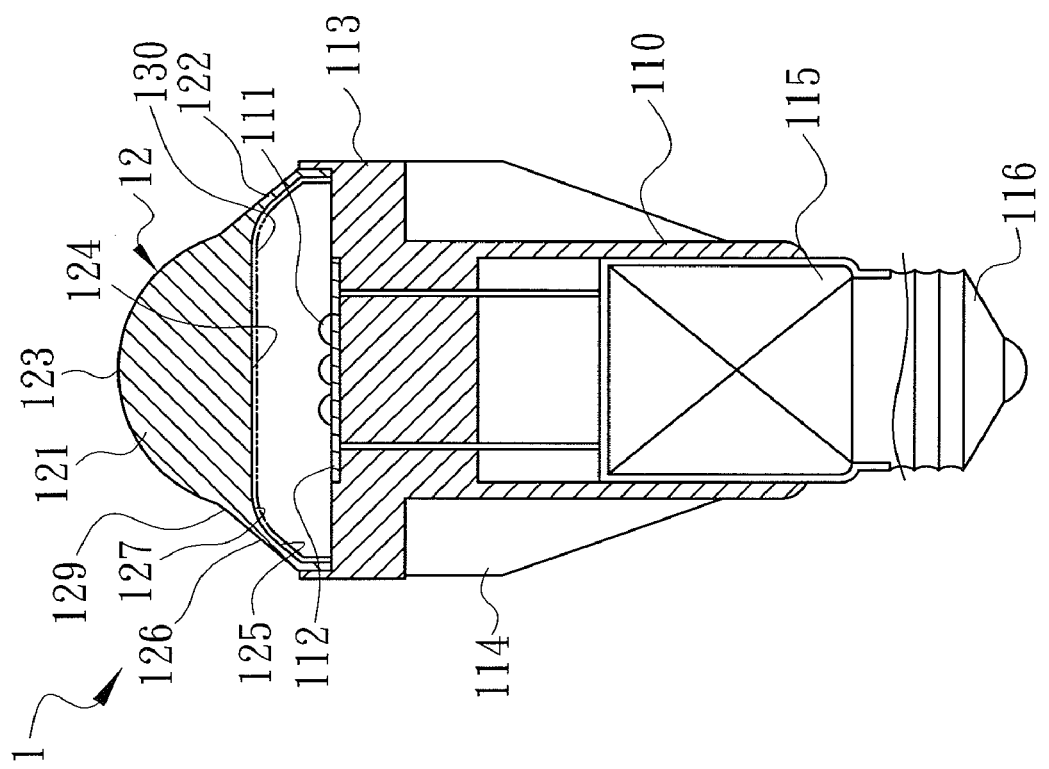
FIG. 5a is a cross sectional view of the bulb of FIG. 4.
Figure 4:
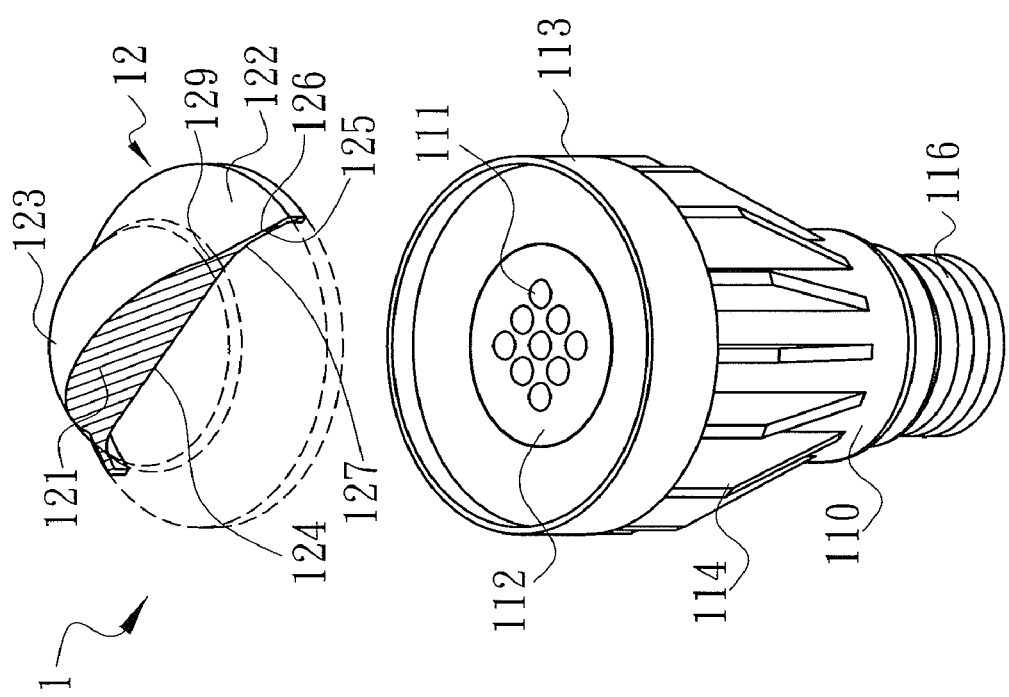
FIG. 4 is an exploded, perspective view of a bulb including a light-transmissive shell according to an embodiment of the present invention.
Figure 6A:
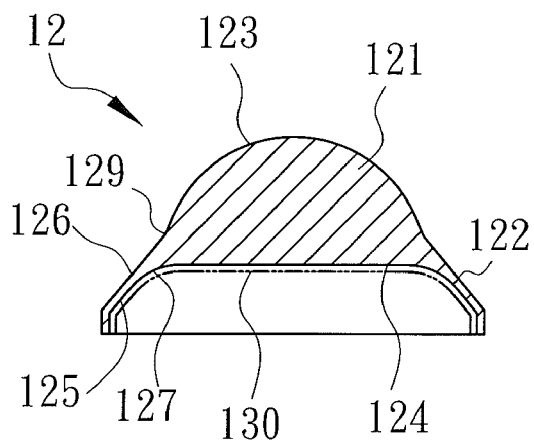
FIGS. 6a through 6c are cross sectional views of the light-transmissive shells of FIGS. 5a through 5c, respectively.
Figure 6B:
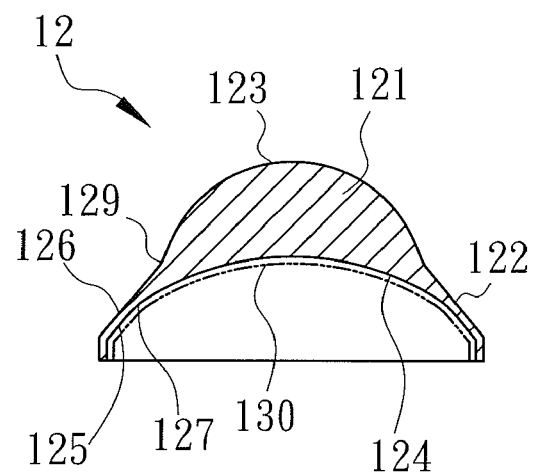
Figure 6C:
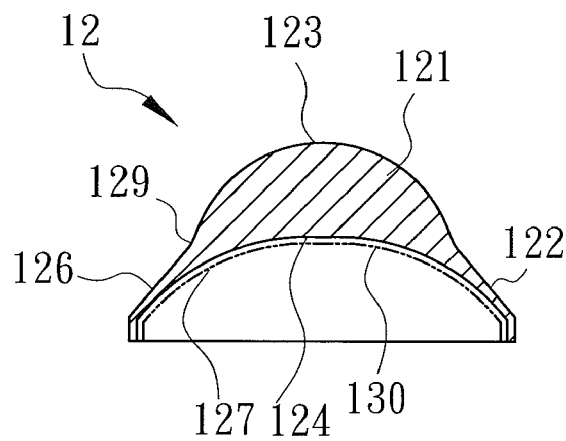

A light-transmissive shell of a first embodiment of the present invention is shown in FIGS. 4, 5a, and 6a of the drawings and generally designated 12. The light-transmissive shell 12 is applied to a light bulb 1. The bulb 1 includes a substrate 112 (of optionally copper or aluminum), an illuminant 111, such as a LED light source (a SMD LED or a chip), provided on the substrate 112, a heat sink 113 connected to the substrate 112, a lamp holder 110 with fins 114, a driver 115 electrically connected to the illuminant 111 for driving the illuminant 111 to light up, a lamp socket 116 electrically connected to the driver 115, and the light-transmissive shell 12 covering the illuminant 111. The heat sink 113 is used to transmit the heat generated by the illuminant 111 to the outside.

The light-transmissive shell 12 includes a lens body 121 and an extension portion 122 integrally extended from the lens body 121. The lens body 121 includes an outer top surface 123 and an inner bottom surface 124 opposite to and spaced from outer top surface 123 in a vertical direction. In the preferred form shown, the thickness of lens body 121 is increasingly convergent around and from the center. The outer top surface 123 is structured as a convex face, while the inner bottom surface 124 is structured as a flat surface. In another preferred form, the inner bottom surface 124 of lens body 121 is structured as an inner concave face (see FIGS. 5b, 6b, and 5c, 6c). The curved radian of the inner bottom surface 124 of lens body 121 may be changed in demand. With the inner concave face, the light projected by the illuminant 111 may be widely focused to collect most of the light into the lens body 121 for projecting intensified light.

The extension portion 122 includes an outer surface 126 extending around from an outer edge (not labeled) of the outer top surface 123 of the lens body 121, and an inner surface 125 opposite to the outer surface 126 and extending around from an outer edge (not labeled) of the inner bottom surface 124 of the lens body 121. In the preferred form shown, the extension portion 122 is extended outwards from the lens body 121 at an acute angle to the vertical direction so that an opening (not labeled) facing downwards is defined between the extension portion 122 and the inner bottom surface 124 of lens body 121. Further, an arcuate surface 127 is formed as a joint between the inner bottom surface 124 of lens body 121 and the inner surface 125 of extension portion 122. Namely, the outer edge of the inner bottom surface 124 of the lens body 121 and a portion of the inner surface 125 of the extension portion 122 adjacent to the outer edge of the inner bottom surface 124 is jointly structured as the arcuate surface 127. The lens body 121 may transmit the light vertically projected by the illuminant 111 for achieving the effect of light intensification. The side-angle light of illuminant 111 may be projected out through the extension portion 122 and the arcuate surface 127 for intensifying the light and transmitting the light at a wide angle and, thus, making a wide-area halation in effect. Further, an arcuate concave 129 is formed as a joint between the outer surface 126 of extension portion 122 and the outer top surface 123 of lens body 121. Namely, the outer edge of the outer top surface 123 of the lens body 121 and a portion of the outer surface 126 of the extension portion 122 adjacent to the outer edge of the outer top surface 123 are jointly structured as the arcuate concave 129 to balance the side-angle light of illuminant 111. Alternatively, no arcuate concave 129 is formed between the outer surface 126 of extension portion 122 and the outer top surface 123 of lens body 121 (see FIGS. 7a through 7c).

Figure 7A:
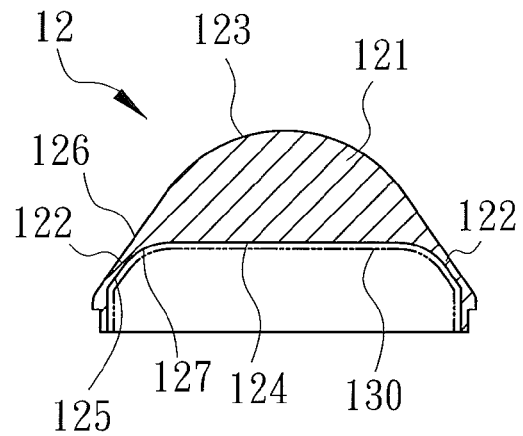
FIGS. 7a through 7c show three modified embodiments of the light-transmissive shells of FIGS. 6a through 6c, respectively.
Figure 7B:
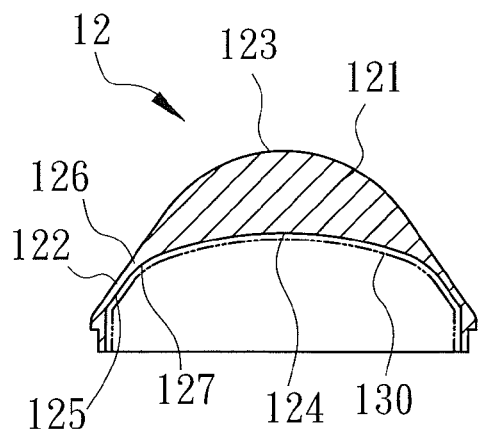
Figure 7C:
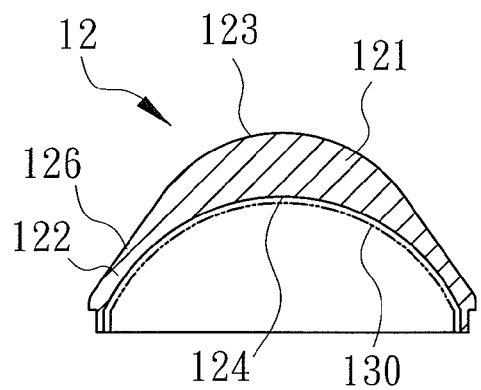
Figures 8A, 8B, 8C:
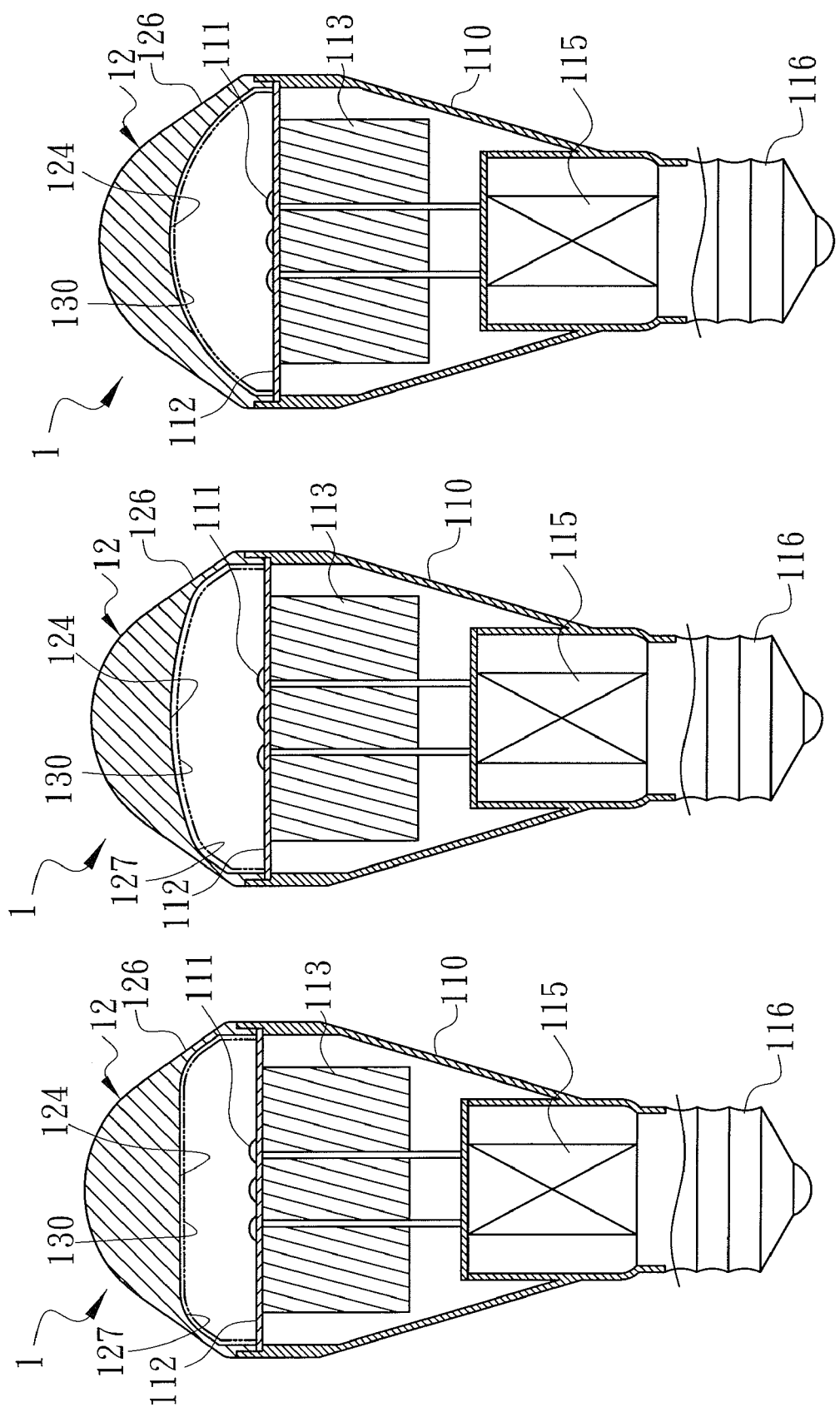
FIGS. 8a through 8c show the light-transmissive shells shown in FIGS. 7a through 7c that are applied to different types of bulbs.

With reference to FIGS. 8a through 8c, bulbs 1 provided with the light-transmissive shell 12 shown in FIGS. 7a through 7c are illustrated, and the heat sink 113 is provided in the lamp holder 110. Further, a matte surface layer 130 is formed on the inner surface 125 of extension portion 122, the inner bottom surface 124 of lens body 121, and the arcuate surface 127 by matte processing (such as sandblasting), matte paper paste, laser processing, or injection molding. The matte surface layer 130 may eliminate the section difference of luminance outside the projection aperture to form a visible residual light and widen the illumination area for achieving the effect of even light.

Figure 9A:
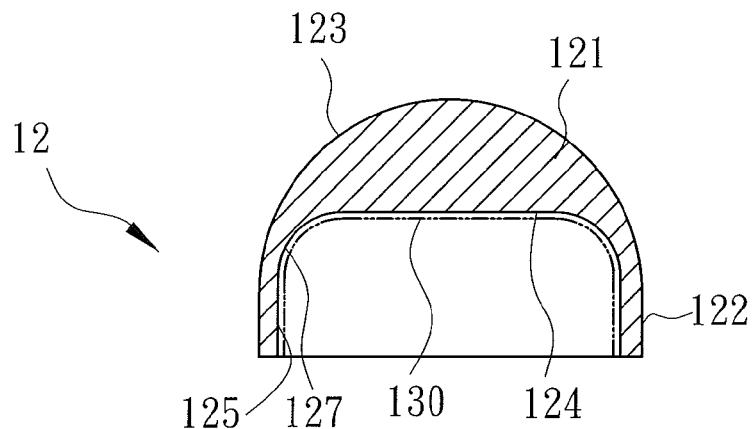
FIGS. 9a through 9c are cross sectional views of three modified embodiments of the light-transmissive shells of FIGS. 7a through 7c, respectively.
Figure 9B:
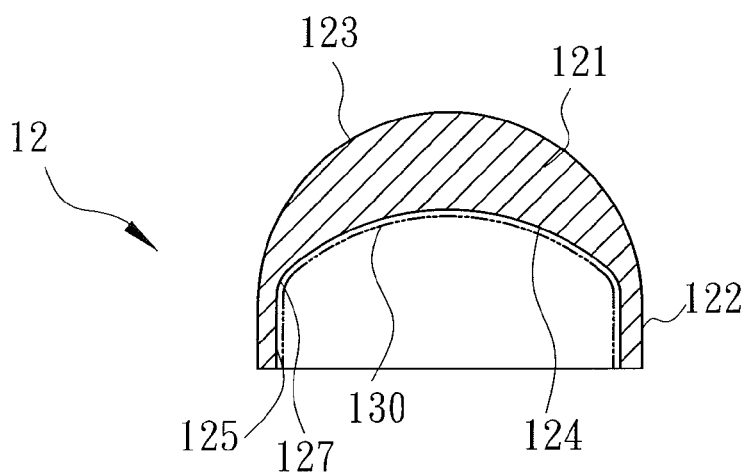
Figure 9C:
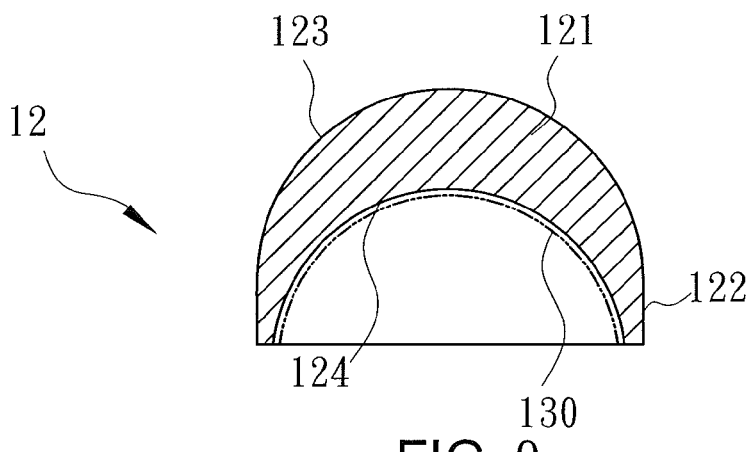
Figures 10A, 10B, 10C:
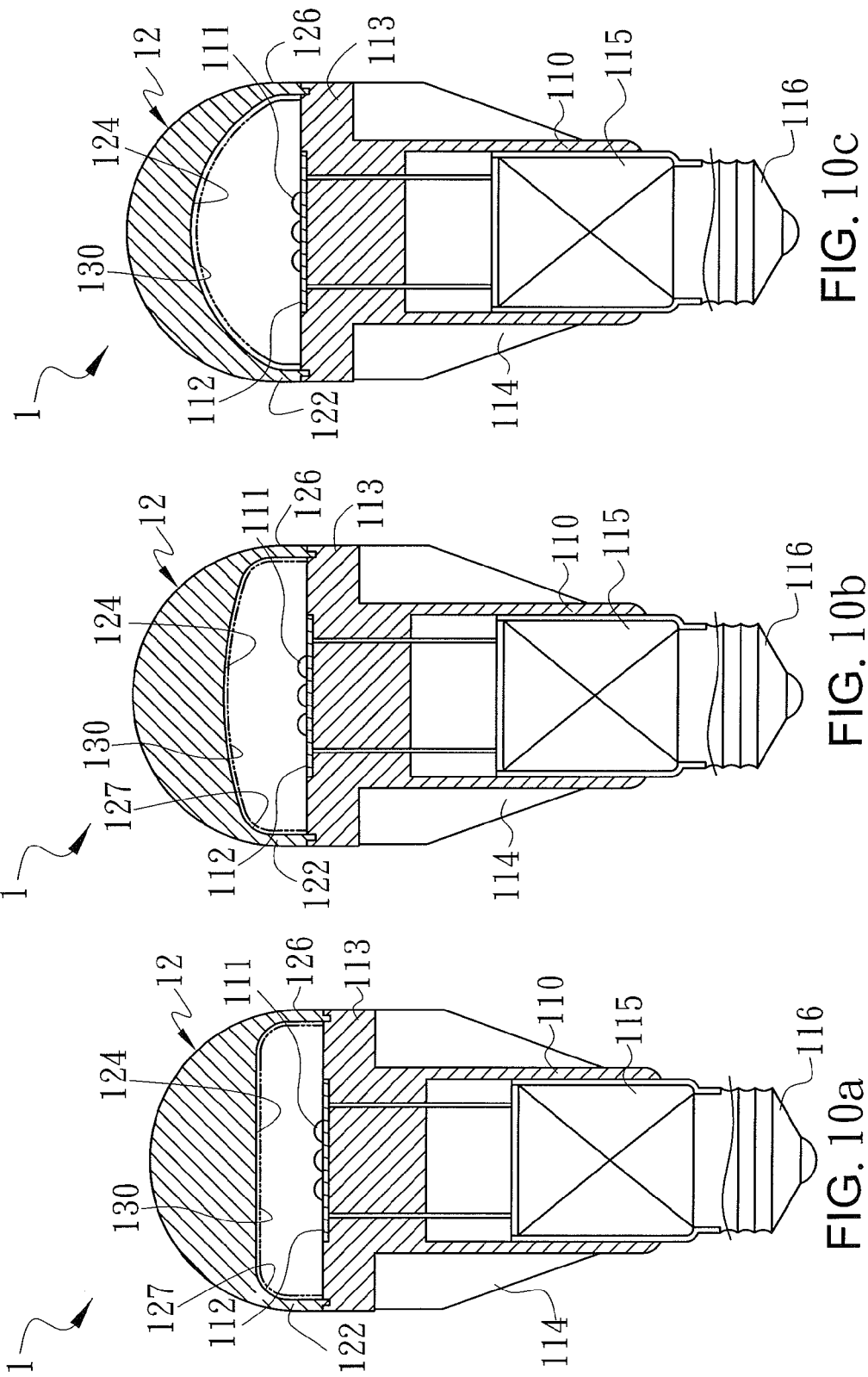
FIGS. 10a through 10c show the light-transmissive shells shown in FIGS. 9a through 9c that are applied to bulbs.

FIGS. 9a through 9c show alternate embodiments of extension portion 122 of the light-transmissive shell 12 according to the present invention. In the embodiments, the extension portion 122 is integrally extended from the lens body 121 in the vertical direction so that an opening facing downwards is defined between the extension portion 122 and the inner bottom surface 124 of lens body 121. With reference to FIGS. 10a through 10c, bulbs 1 provided with the light-transmissive shell 12 shown in FIGS. 9a through 9c are illustrated, and the heat sink 113 of each bulb 1 is integrally connected to the lamp holder 110.

Figure 11A:
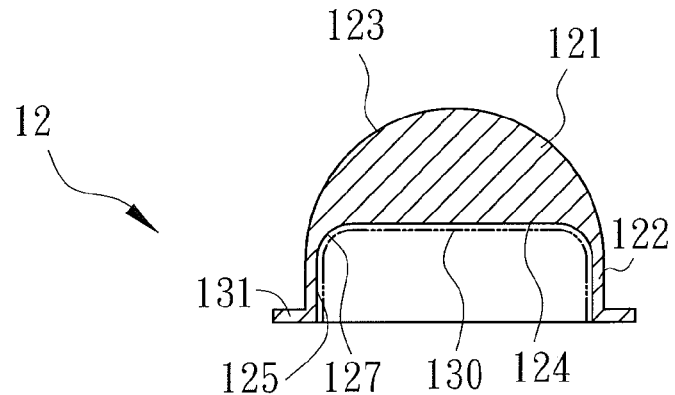
FIGS. 11a through 11c are cross sectional views of three modified embodiments of the light-transmissive shells of FIGS. 9a through 9c, respectively.
Figure 11B:
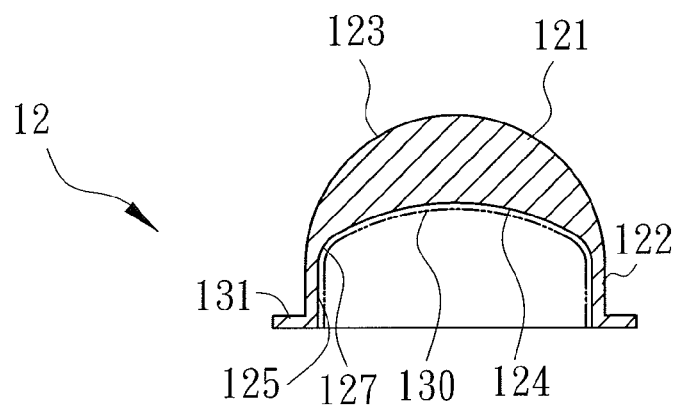
Figure 11C:
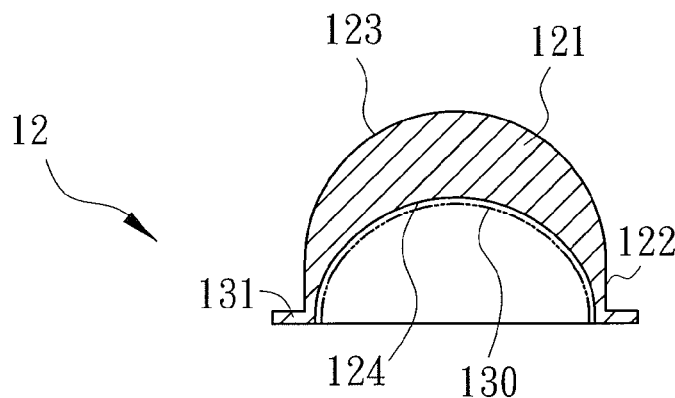
Figure 12A:
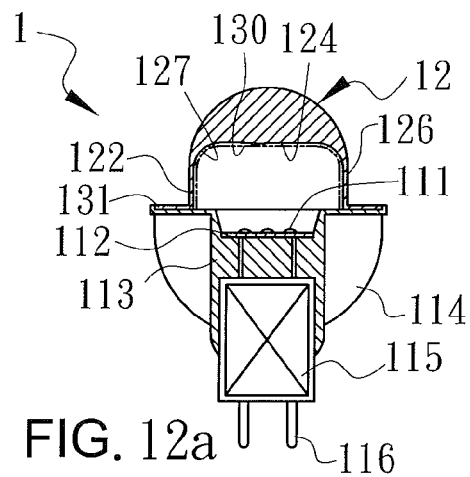
FIGS. 12a through 12f show the light-transmissive shells shown in FIGS. 9a through 9c that are applied to different types of bulbs.
Figure 12D:
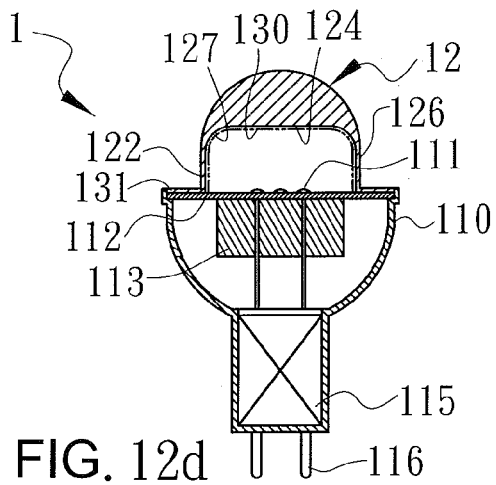
Figure 12B:
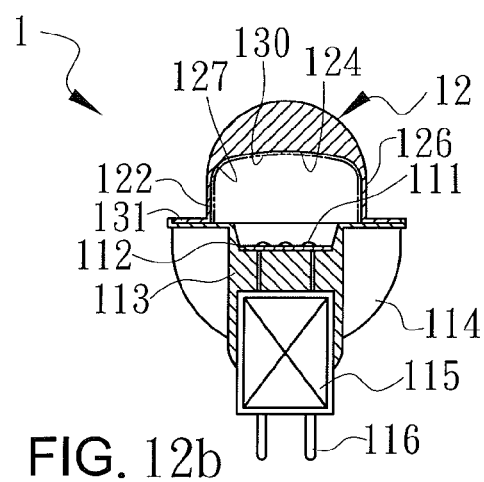
Figure 12E:
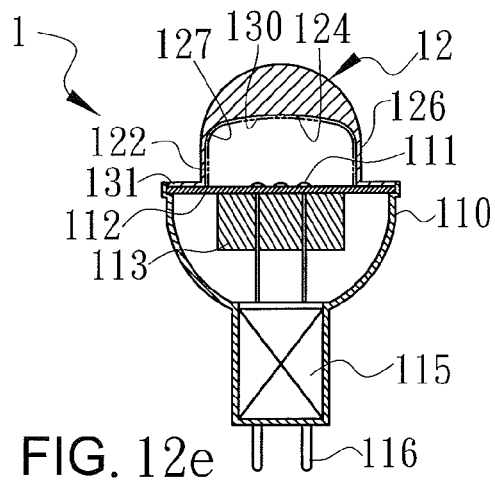
Figure 12C:
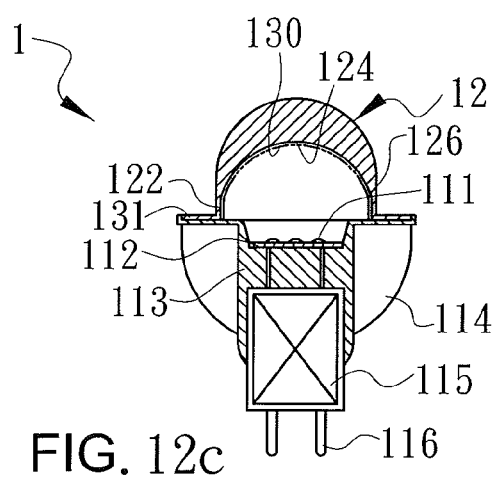
Figure 12F:
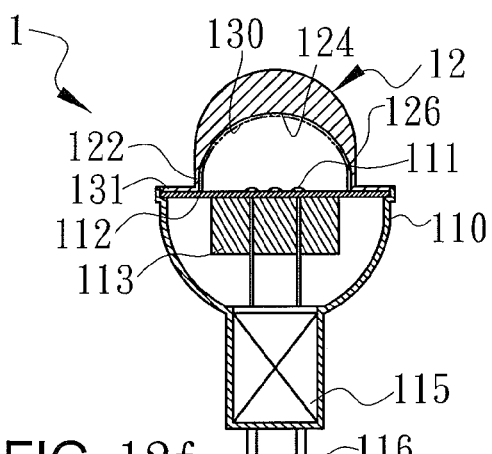
Figure 13A:
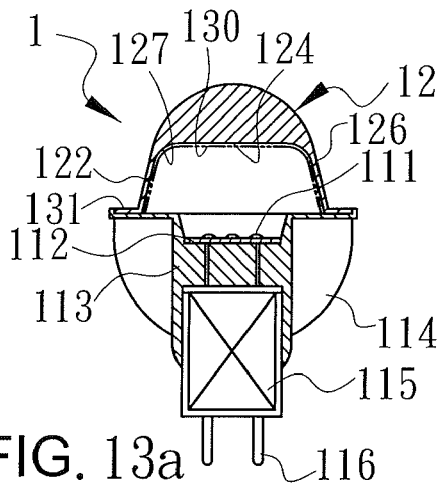
FIGS. 13a through 13f show cross sectional views of six modified embodiments of the light-transmissive shells of FIGS. 12a through 12f, respectively, that are applied to different types of bulbs.
Figure 13D:
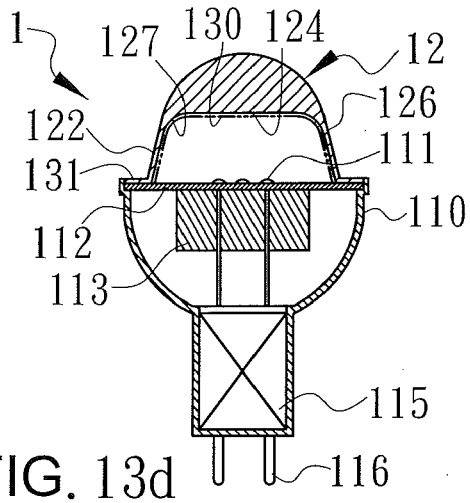
Figure 13B:
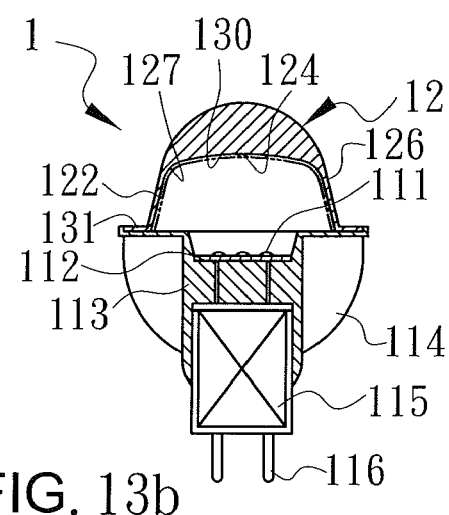
Figure 13E:
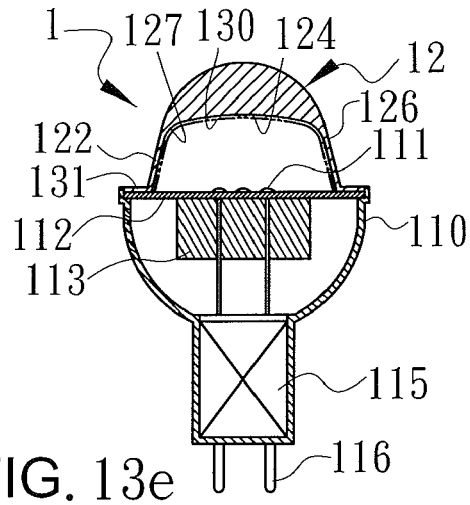
Figure 13C:
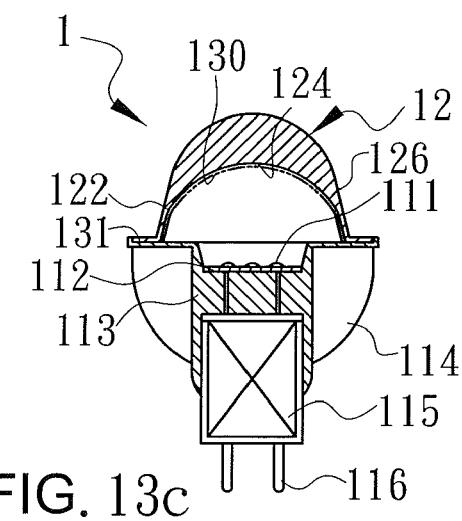
Figure 13F:
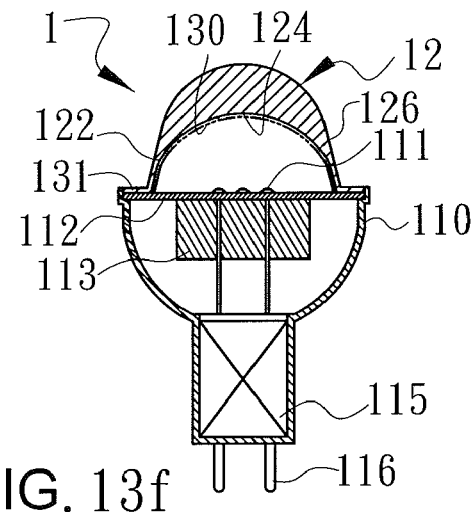

FIGS. 11a through 11c show modifications of the extension portions 122 of the light-transmissive shells 12 shown in FIGS. 9a through 9c. An annular portion 131 is extended from a lower edge of each extension portion 122 in a horizontal direction. With reference to FIGS. 12a through 12f, bulbs 1 provided with the light-transmissive shells 12 shown in FIGS. 11a through 11c are illustrated, with lamp socket 116 in each bulb 1 being in the form of two terminals. The annular portion 131 of each extension portion 122 is connected to the heat sink 113 of each bulb 1.

FIGS. 13a through 13f show modifications of the extension portions. 122 of the light-transmissive shell 12 shown in FIGS. 12a through 12f. The extension portion 122 of each light-transmissive shell 12 is integrally extended from the lens body 121 at an acute angle to the vertical direction.

Figure 14:
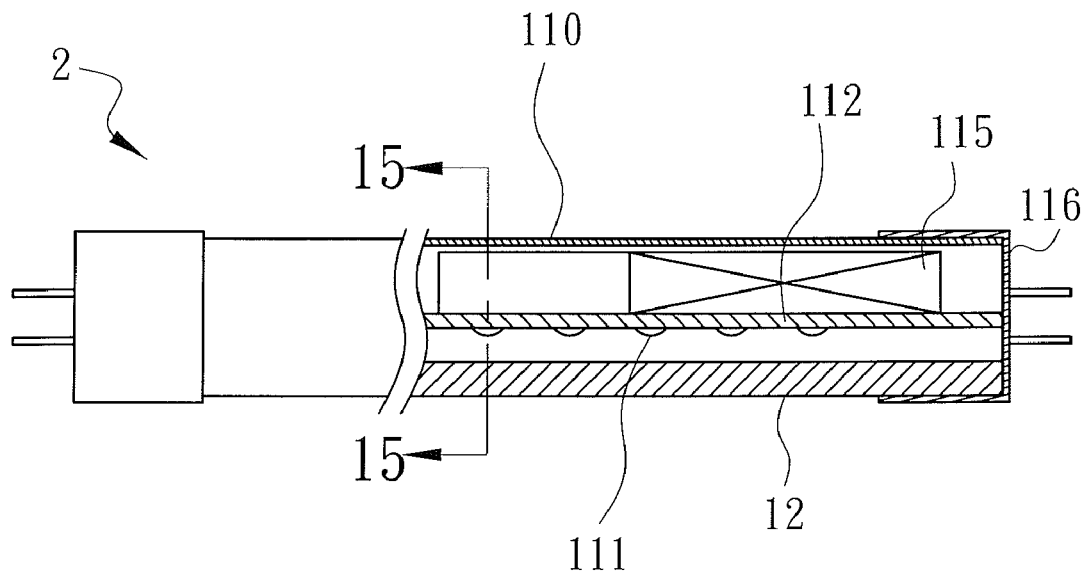
FIG. 14 is a schematic view illustrating the light-transmissive shell according to the present invention that is applied to a lamp tube.
Figure 15A:
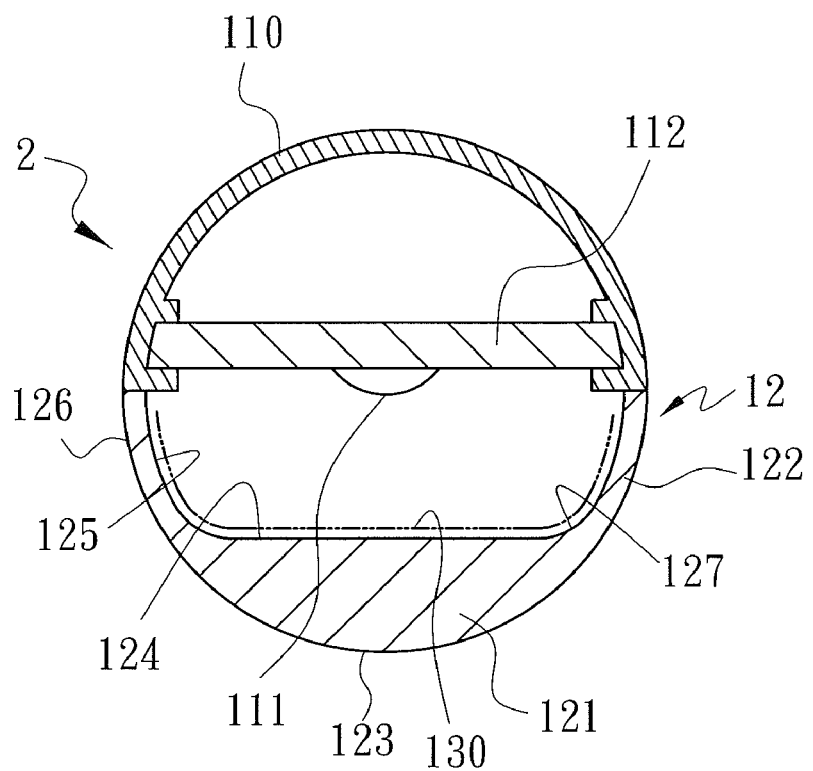
FIG. 15a is a cross sectional view of the lamp tube of FIG. 14 taken along sectional line 15-15 of FIG. 14.
Figure 15B:
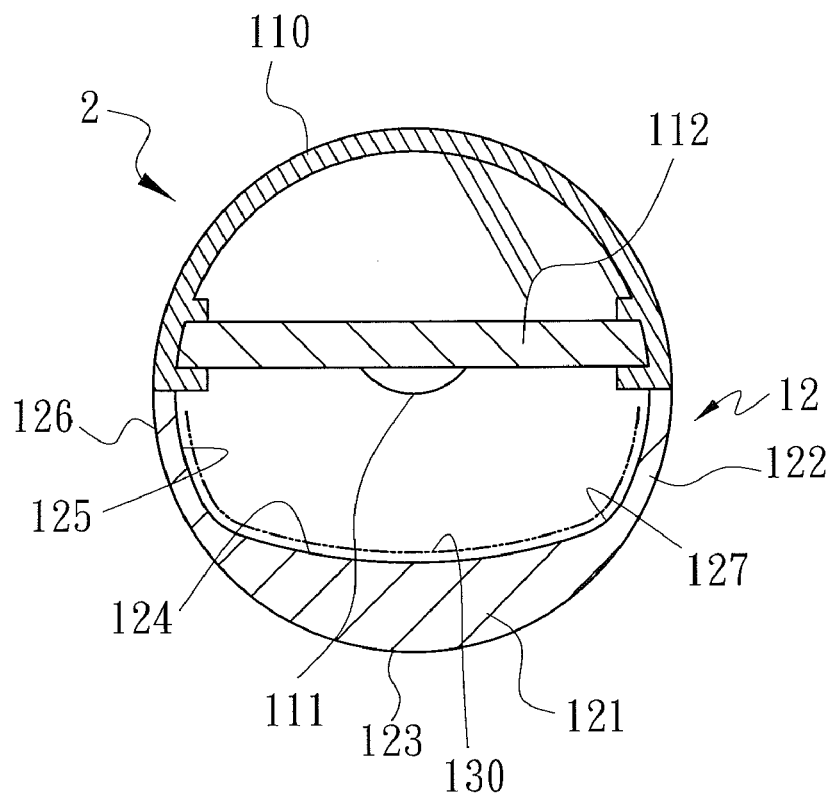
FIGS. 15b and 15c show two modified embodiments of the light-transmissive shell of FIG. 15a that are respectively applied to the lamp tube.
Figure 15C:
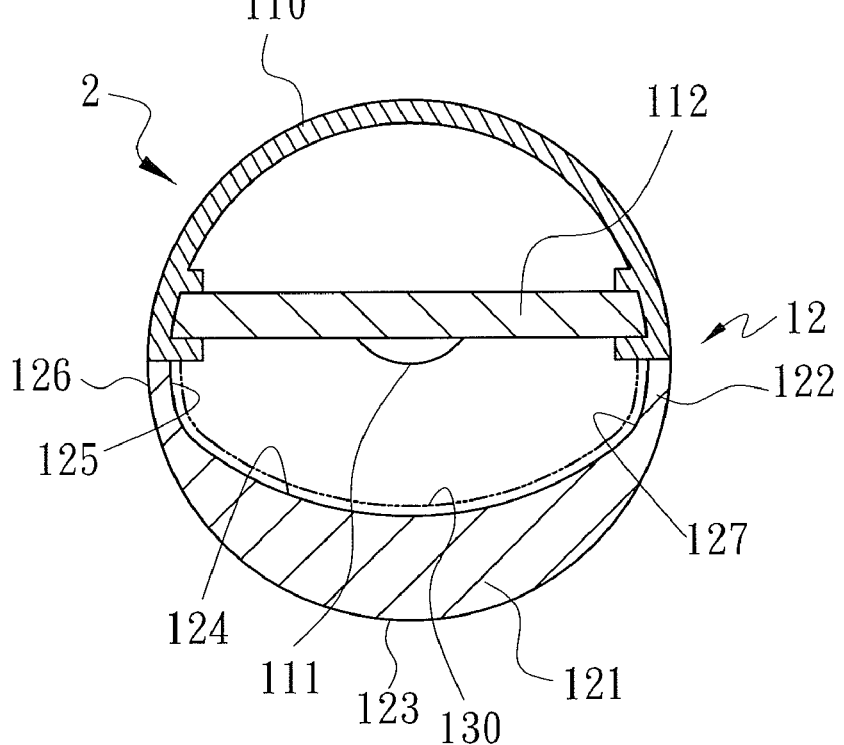

FIGS. 14 and 15a illustrate an embodiment of the light-transmissive shell 12 according to this invention that is applied to a lamp tube 2. The lamp tube 2 includes an illuminant 111, a substrate 112, a driver 115, a lamp socket 116, a lamp holder 110, and the light-transmissive shell 12. The lamp holder 110 is connected to the light-transmissive shell 12 and defines a space accommodating the light illuminant 111, the substrate 112, and the driver 115. The lamp socket 116 is provided at two sides of lamp holder 110 for connecting with an external power supply. The light-transmissive shell 12 includes a lens body 121 and an extension portion 122. The lens body 121 includes an outer top surface 123 formed into a convex face and an inner bottom surface 124 formed into a flat surface (FIG. 15a) or an inner concave face (FIGS. 15b and 15c). With the inner concave face, the light projected by the illuminant 111 may be widely focused to collect most of the light into the lens body 121 for projecting intensified light. The extension portion 122 includes an inner surface 125 extending around from an outer edge of the inner bottom surface 124 of the lens body 121. An arcuate surface 127 is formed as a joint between the inner bottom surface 124 of lens body 121 and the inner surface 125 of extension portion 122. The lens body 121 may transmit the light vertically projected by the illuminant 111 for achieving the effect of light intensification. The side-angle light of illuminant 111 may be projected out through the extension portion 122 and the arcuate surface 127 for intensifying the light and transmitting the light at a wide angle and, thus, making a wide-area halation in effect.

Figure 16:
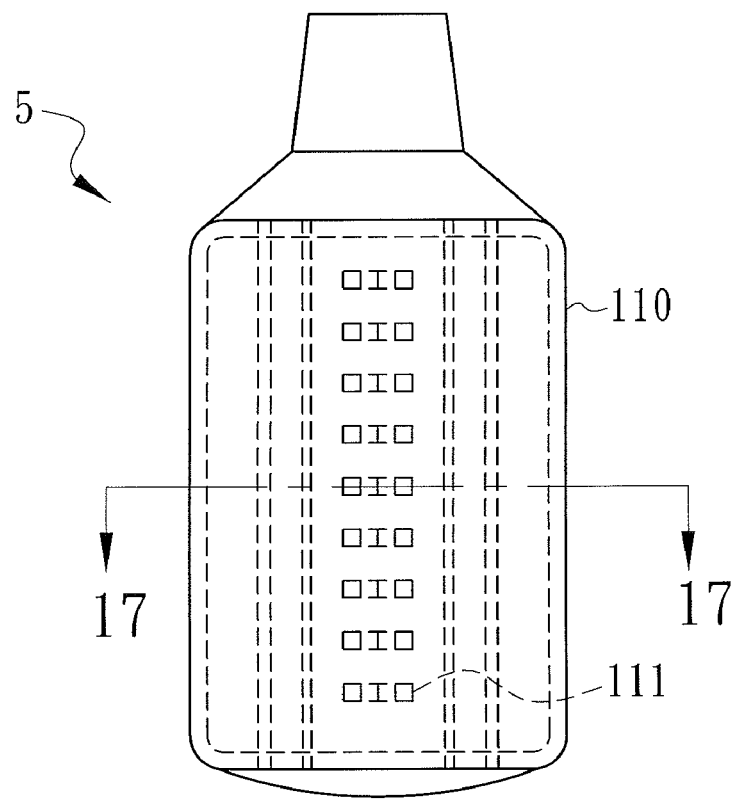
FIG. 16 is a schematic view illustrating the light-transmissive shell according to the present invention that is applied to a street lamp.
Figure 17A:
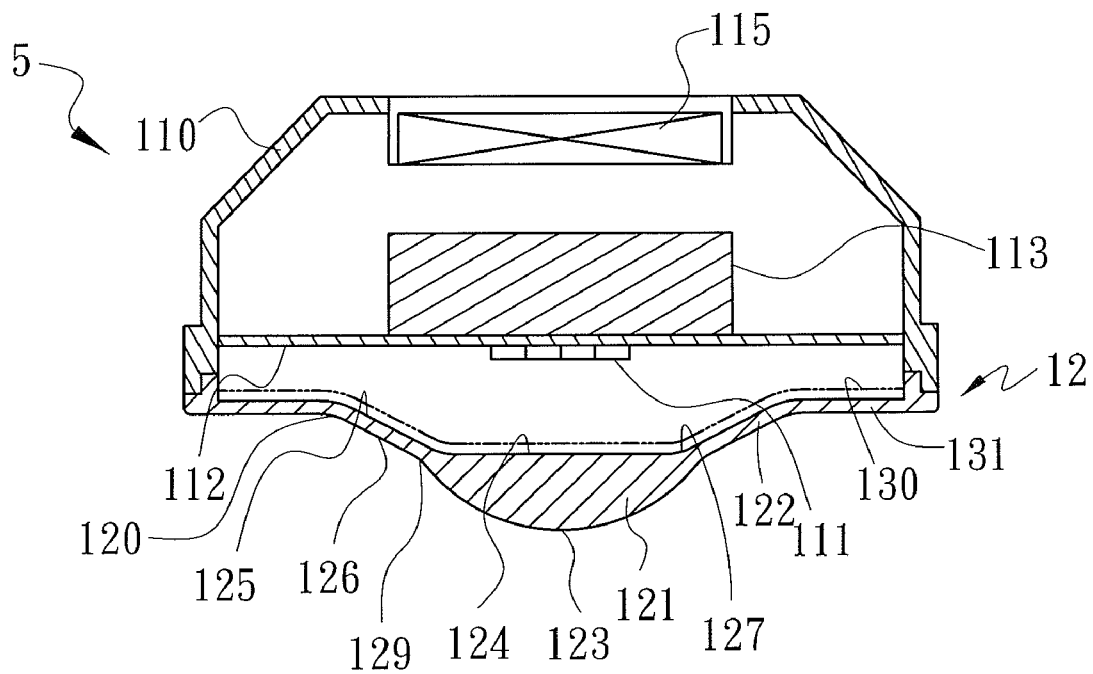
FIG. 17a is a cross sectional view of the lamp tube of FIG. 16 taken along sectional line 17-17 of FIG. 16.
Figure 17B:
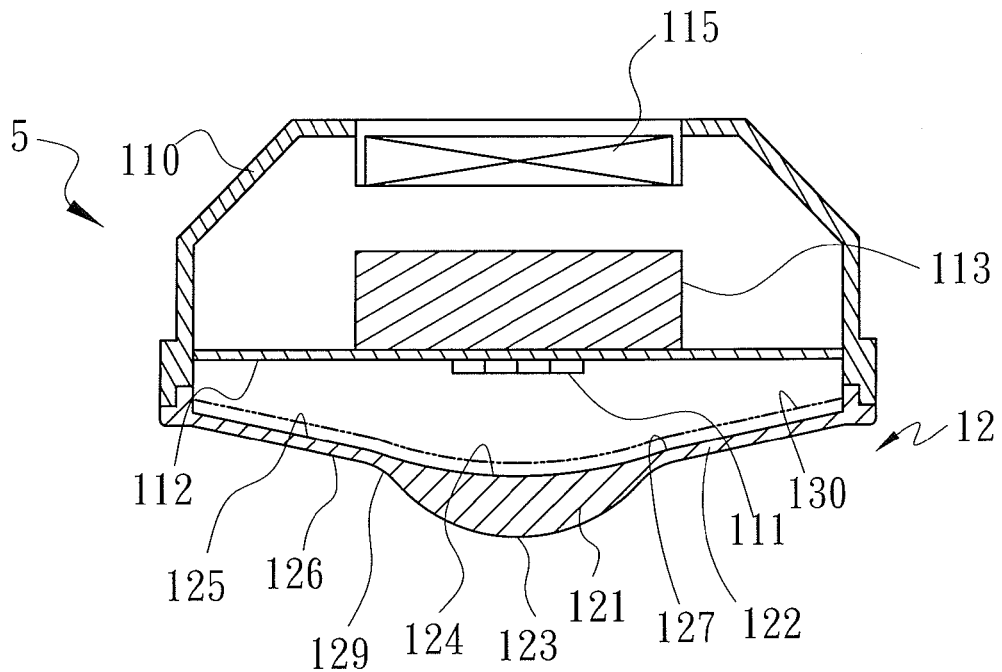
FIGS. 17b and 17c show two modified embodiments of the light-transmissive shell of FIG. 17a that are respectively applied to the street lamp.
Figure 17C:
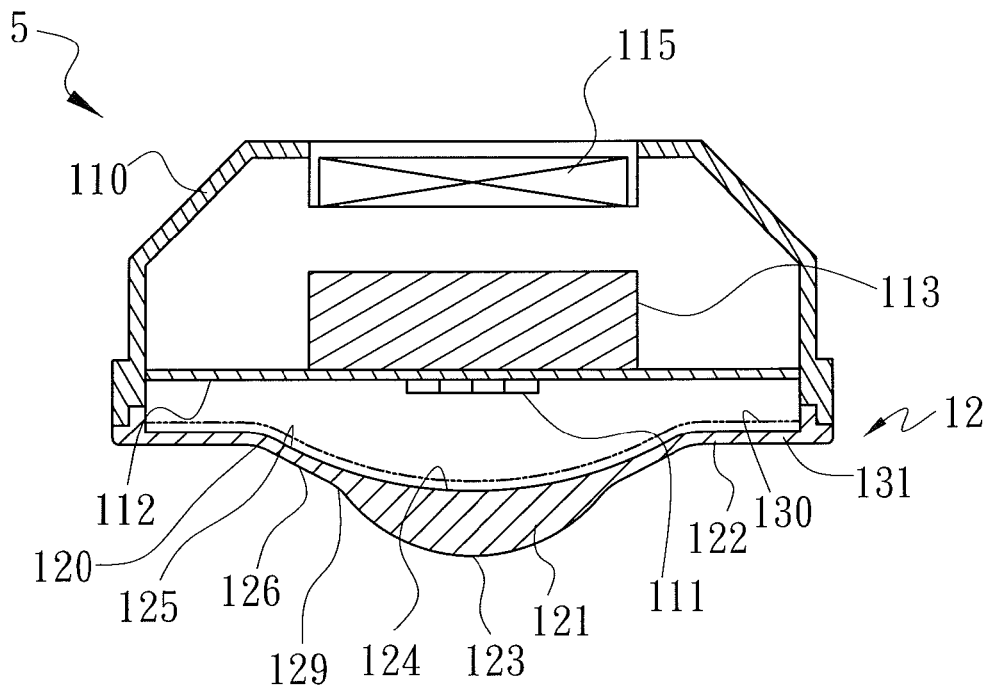

FIGS. 16, and 17a illustrate an embodiment of the light-transmissive shell 12 according to this invention that is applied to a street lamp 5. The light-transmissive shell 12 includes a lens body 121 and an extension portion 122. The lens body 121 includes an outer top surface 123 formed into a convex face and an inner bottom surface 124 formed into a flat surface (FIG. 17a) or an inner concave face (FIGS. 17b and 17c). The extension portion 122 includes an inner surface 125 extending around from an outer edge of the inner bottom surface 124 of the lens body 121. An arcuate surface 127 is formed as a joint between the inner bottom surface 124 of lens body 121 and the inner surface 125 of extension portion 122. Furthermore, an annular extension 131 extends outwards from the extension portion 122 of light-transmissive shell 12, and an arc portion 120 is formed between the annular extension 131 and the extension portion 122 (FIGS. 17a and 17c). Further, a matte surface layer 130 is formed on the inner surface 125 of extension portion 122, the inner bottom surface 124 of lens body 121, and the arcuate surface 127.

Now that the basic teachings of the present invention have been explained, many extensions and variations will be obvious to one having ordinary skill in the art. With reference to FIGS. 18a through 18c, the light-transmissive shell 12 according to this invention may be used for a multi-structural LED bulb of narrow emission angle and wide focusing transmission light. A LED chip 111 is mounted on the surface of heat sink 113, and the heat sink 113 is covered with the light-transmissive shell 12 to package the LED chip 111. With reference to FIGS. 19a through 19c, the light-transmissive light 12 according to this invention is used to mount several LED chips 111 on the substrate 112 and package several LED chips 111 into a wide focusing structure. With reference to FIGS. 20a through 20c, the light-transmissive shell 12 according to this invention is used to package several LED chips 111 into SMD LEDs.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

The invention claimed is:

1. A light-transmissive shell for a bulb or a lamp comprising, in combination:

a lens body covering a LED light source and including a center, an outer top surface and an inner bottom surface opposite to the outer top surface, with the outer top surface of the lens body being structured as a convex face, with a thickness between the inner bottom surface and the outer top surface of the lens body being increasingly convergent around and from the center; and an extension portion including an outer surface and an inner surface opposite to the outer surface, with the outer surface of the extension portion extending around and from an outer edge of the outer top surface of the lens body, with the inner surface of the extension portion extending around and from an outer edge of the inner bottom surface of the lens body, with an arcuate surface formed as a joint between the inner bottom surface of the lens body and the inner surface of the extension portion, allowing a side angle light of the LED light source projected through the extention portion and the accurate surface.

2. The light-transmissive shell according to claim 1, with the inner bottom surface of the lens body being structured as a flat surface from the outer edge of the inner bottom surface to the center.

3. The light-transmissive shell according to claim 2, with an annular, arcuate concave formed as a joint between the outer top surface of the lens body and the outer surface of the extension portion.

4. The light-transmissive shell according to claim 3, with a matte surface layer formed on the inner surface of the extension portion and on the inner bottom surface of the lens body.

5. The light-transmissive shell according to claim 2, with the extension portion integrally extended from the lens body in a vertical direction or at an acute angle to the vertical direction.

6. The light-transmissive shell according to claim 5, with a matte surface layer formed on the inner surface of the extension portion and on the inner bottom surface of the lens body.

7. The light-transmissive shell according to claim 1, with the inner bottom surface of the lens body being structured as an inner concave face from the outer edge of the inner bottom surface to the center.

8. The light-transmissive shell according to claim 7, with an annular, arcuate concave formed as a joint between the outer top surface of the lens body and the outer surface of the extension portion.

9. The light-transmissive shell according to claim 8, with a matte surface layer formed on the inner surface of the extension portion and on the inner bottom surface of the lens body.

10. The light-transmissive shell according to claim 7, with the extension portion integrally extended from the lens body in a vertical direction or at an acute angle to the vertical direction.

11. The light-transmissive shell according to claim 10, with a matte surface layer formed on the inner surface of the extension portion and on the inner bottom surface of the lens body.

12. A lamp comprising:
a LED light source; and
a light-transmissive shell comprising:

a lens body covering the LED light source and including a center, an outer top surface and an inner bottom surface opposite to the outer top surface in a vertical direction, with the outer top surface of the lens body being structured as a convex face, with the inner bottom surface of the lens body facing the LED light source, with a thickness between the inner bottom surface and the outer top surface of the lens body being increasingly convergent around and from the center; and an extension portion mounted around the LED light source and including an outer surface and an inner surface opposite to the outer surface, with the outer surface of the extension portion extending around and from an outer edge of the outer top surface of the lens body, with the inner surface of the extension portion extending around and from an outer edge of the inner bottom surface of the lens body, with an arcuate surface formed as a joint between the inner bottom surface of the lens body and the inner surface of the extension portion, allowing a side-angle light of the LED light source to be projected out through the extension portion and the arcuate surface.

13. The lamp according to claim 12, with the inner bottom surface of the lens body being structured as an inner concave face from the outer edge of the inner bottom surface to the center.

14. The lamp according to claim 13, with an annular, arcuate concave formed as a joint between the outer top surface of the lens body and the outer surface of the extension portion, and with the annular, arcuate concave opposite to the arcuate surface in the vertical direction for balancing the side-angle light of the LED light source.

15. The lamp according to claim 14, with the extension portion integrally extended from the lens body in the vertical direction or at an acute angle to the vertical direction.

16. The lamp according to claim 15, with a matte surface layer formed on the inner surface of the extension portion and on the inner bottom surface of the lens body.

17. The lamp according to claim 12, with the inner bottom surface of the lens body being structured as a flat surface from the outer edge of the inner bottom surface to the center.

18. The lamp according to claim 17, with an annular, arcuate concave formed as a joint between the outer top surface of the lens body and the outer surface of the extension portion, and with the annular, arcuate concave opposite to the arcuate surface in the vertical direction for balancing the side-angle light of the LED light source.

19. The lamp according to claim 18, with the extension portion integrally extended from the lens body in the vertical direction or at an acute angle to the vertical direction.

20. The lamp according to claim 19, with a matte surface layer formed on the inner surface of the extension portion and on the inner bottom surface of the lens body.

* * * * *